(12) United States Patent
Nishikawa et al.

(10) Patent No.: US 7,939,923 B2
(45) Date of Patent: May 10, 2011

(54) MEMORY CARD AND METHOD FOR MANUFACTURING MEMORY CARD (75) Inventors: Hidenobu Nishikawa, Nara (JP); Hiroyuki Yamada, Osaka (JP); Shuichi Takeda, Yamagata (JP); Atsunobu Iwamoto, Yamagata (JP)

(73) Assignee: Panasonic Corporation, Osaka (JP)

( * ) Notice: Subject to any disclaimer, the term of this patent is extended or adjusted under 35 U.S.C. 154(b) by 366 days.

(21) Appl. No.: 12/160,954

(22) PCT Filed: Jan. 31, 2007

(86) PCT No.: PCT/JP2007/051541
§ 371 (c)(1), (2), (4) Date: Jul. 15, 2008

(87) PCT Pub. No.: WO2007/088866
PCT Pub. Date: Aug. 9, 2007

(65) Prior Publication Data
US 2010/0193927 A1 Aug. 5, 2010

(30) Foreign Application Priority Data
Feb. 2, 2006 (JP) .................. 2006-025444

(51) Int. Cl.
*H01L 23/02* (2006.01)

(52) U.S. Cl. . 257/679; 257/678; 257/723; 257/E23.003; 257/E25.01; 257/E25.012; 257/E25.026; 257/E23.169; 257/E23.176; 257/E21.532; 257/E21.598; 438/106; 438/124

(58) Field of Classification Search .................. 257/679, 257/685, 723, E25.003, E25.01, E25.011, 257/E25.012, E25.015, E25.026, 922, 692, 257/E23.141, E23.169, E23.176, E21.532, 257/E21.598; 438/6, 28, 66, 67, 107, 109, 406, 455–459, FOR. 211–FOR. 220, FOR. 365–FOR. 368
See application file for complete search history.

(56) References Cited

U.S. PATENT DOCUMENTS
5,838,551 A * 11/1998 Chan .............................. 361/818
7,023,706 B2 4/2006 Negishi et al.
(Continued)

FOREIGN PATENT DOCUMENTS
CN 1442902 A 9/2003
(Continued)

OTHER PUBLICATIONS
Chinese Office Action issued in Chinese Patent Application No. CN 200780003059.4 dated Aug. 2, 2010.
(Continued)

*Primary Examiner* — Jasmine J Clark
(74) *Attorney, Agent, or Firm* — McDermott Will & Emery LLP (57) ABSTRACT

A memory card includes a circuit board, a first semiconductor chip mounted on the circuit board with a bump sandwiched between the first semiconductor chip and the circuit board, a second semiconductor chip mounted on the circuit board with a bump sandwiched between the second semiconductor chip and the circuit board with a clearance not greater than 1 mm between the first semiconductor chip and the second semiconductor chip, a first sealing resin layer surrounding the bump and existing between the first semiconductor chip and the circuit board, and a second sealing resin layer surrounding the bump and existing between the second semiconductor chip and the circuit board, and a cover covering the first semiconductor chip, the second semiconductor chip on a principal face of the circuit board.

13 Claims, 8 Drawing Sheets

U.S. PATENT DOCUMENTS

| | | | |
|---|---|---|---|
| 7,365,426 B2 * | 4/2008 | Naka et al. ................... | 257/723 |
| 7,601,563 B2 * | 10/2009 | Chen et al. ................... | 438/126 |
| 2004/0040871 A1 | 3/2004 | Kakinoki et al. | |

FOREIGN PATENT DOCUMENTS

| CN | 1489108 A | 4/2004 |
|---|---|---|
| JP | 1-299094 | 1/1989 |
| JP | 09-297535 | 11/1997 |
| JP | 9-297535 | 11/1997 |
| JP | 2004-013738 | 1/2004 |
| JP | 2004-087844 | 3/2004 |
| JP | 2005-166891 | 6/2005 |

OTHER PUBLICATIONS

Japanese Office Action issued in Japanese Patent Application No. JP 2007-556873 dated Feb. 15, 2011.

* cited by examiner

FIG. 11

MEMORY CARD AND METHOD FOR MANUFACTURING MEMORY CARD

RELATED APPLICATIONS

This application is the U.S. National Phase under 35 U.S.C. §371 of International Application No. PCT/JP2007/051541, filed on Jan. 31, 2007, which in turn claims the benefit of Japanese Application No. 2006-025444, filed on Feb. 2, 2006, the disclosures of which Applications are incorporated by reference herein.

TECHNICAL FIELD

The present invention relates to a memory card and a method for manufacturing memory card.

BACKGROUND ART

A memory card with a memory chip built therein has been used in these years as one of recording media for storing information. Since the memory card is excellent in portability, it has been widely used as a recording medium of portable electronic devices such as a portable information terminal or a cell phone.

These portable electronic devices have been downsized and reduced their thicknesses in order to improve the portability. This market trend requires the memory card to be downsized and have a thinner body. On top of that, the memory card is specified its shape, size, and thickness by the trade standard, so that the memory card must meet this standard before it achieves a greater capacity.

On a memory chip mounted on a lead frame, another memory chip is layered but shifted from the previous one. The electrodes of these two memory chips and an electrode of a control chip mounted on the lead frame are coupled to the lead frame via a gold wire, so that the thickness of the memory card can be reduced. This technique is disclosed in, e.g. patent document 1.

However, the memory card disclosed in patent document 1 is limited to decrease its thickness because the memory chips are layered together. This structure also complicates the memory card in construction. The memory chips and the control chip are mounted onto the lead frame by a wire bonding method, so that the chips, wires, and lead frame need to be sealed with thermosetting resin after they are mounted. At this time, a sealing layer is to be thick enough for covering the memory chips and the wires, so that the memory card is limited to be downsized or to be thinner. Since a sealing step is needed in addition to the mounting step, a reduction in the manufacturing cost is limited.

A flip-chip mounting method is available as one of the methods of mounting semiconductor chips, such as a memory chip and a control chip, onto a circuit board. This method bonds an electrode of a semiconductor chip to an electrode of a circuit board with a bump therebetween. According to the flip-chip mounting method, a semiconductor chip is urged against a circuit board via resin applied to an electrode of the circuit board, and the resin is hardened in this state for mounting the semiconductor chip to the circuit board. This method allows eliminating a sealing layer supposed to cover the semiconductor chip mounted on the circuit board, so that the memory card can be smaller and thinner than the memory card disclosed in patent document 1. In this case, a memory chip and a control chip are not layered together on the circuit board, but they are preferably placed flat on the circuit board in order to reduce the thickness of the memory card. These semiconductor chips are preferably placed as close as possible to each other in order to downsize the memory card.

However, the foregoing flip-chip mounting method has the following problems: When a semiconductor chip is urged against a circuit board, the resin beneath the semiconductor chip spreads over the surrounding of the chip, and hardens in this state. When a plurality of semiconductor chips are placed as close as not greater than 1 mm to each other, the resin to be used for mounting one semiconductor chip spreads over the area supposed to be used for mounting the other semiconductor chips, and hardens there. A resin layer applied to an area where another chip is supposedly mounted changes in quality because the resin of one semiconductor chip is hardened. As a result, it is difficult to mount this another semiconductor chip to the supposed area. To overcome the spread of the resin layer or the change in quality, if the semiconductor chips are placed with a space over 1 mm between each one of the semiconductor chips, the memory card will not be downsized. As discussed above, it is difficult to mount the semiconductor chips as close as possible, e.g. not greater than 1 mm between each semiconductor chip, so that the memory card is limited to be smaller. Patent Document 1: Unexamined Japanese Patent Publication No. 2004-13738

DISCLOSURE OF INVENTION

A memory card of the present invention comprises the following elements:
  a circuit board;
  a first semiconductor chip mounted on a principal face of the circuit board with a bump sandwiched therebetween;
  a second semiconductor chip mounted on the principal face of the circuit board with a bump sandwiched therebetween and with a clearance not greater than 1 mm to the first semiconductor chip;
  a first sealing layer for surrounding the bump bonded to the first semiconductor chip and existing between the first semiconductor chip and the circuit board;
  a second sealing layer for surrounding the bump bonded to the second semiconductor chip and existing between the second semiconductor chip and the circuit board; and
  a cover disposed over the principal face of the circuit board for covering the first semiconductor chip and the second semiconductor chip.

The foregoing structure allows simplifying the memory card in construction and achieving the smaller as well as the thinner memory card.

A method of manufacturing the same memory card as discussed above comprises:
  (a) forming a first sealing resin layer on a principal face of a circuit board;
  (b) forming a second sealing resin layer on the principal face of the circuit board;
  (c) urging the first semiconductor chip against the principal face of the circuit board with a bump therebetween via the first sealing resin layer for electrically coupling the first semiconductor chip to the circuit board, and hardening the first sealing resin layer;
  (d) in parallel with step (c), urging the second semiconductor chip against the principal face of the circuit board with a bump therebetween via the second sealing resin layer for electrically coupling the second semiconductor chip to the circuit board, and hardening the second sealing resin layer; and
  (e) covering the first semiconductor chip and the second semiconductor chip with a cover disposed over the principal face of the circuit board.

DESCRIPTION OF REFERENCE MARKS 1, 1a, 1c, 1d. memory card
2. circuit board
3. first semiconductor chip
4. sealing resin layer
5. second semiconductor chip
6. chip component
7. cover
8. third semiconductor chip
21. top face
22. under face
23. linear protrusion
24. linear recess
33, 53, 83. bump
41. first sealing resin layer
42. second sealing resin layer
43. third sealing resin layer
71. recess
91. urging tool
92. heater
211, 212, 213, 214. electrode
221. external electrode

DESCRIPTION OF PREFERRED EMBODIMENTS

Exemplary embodiments of the present invention are demonstrated hereinafter with reference to the accompanying drawings. Similar elements in the exemplary embodiments have the same reference marks, and the descriptions thereof are sometimes omitted.

First Exemplary Embodiment

Figure 1:
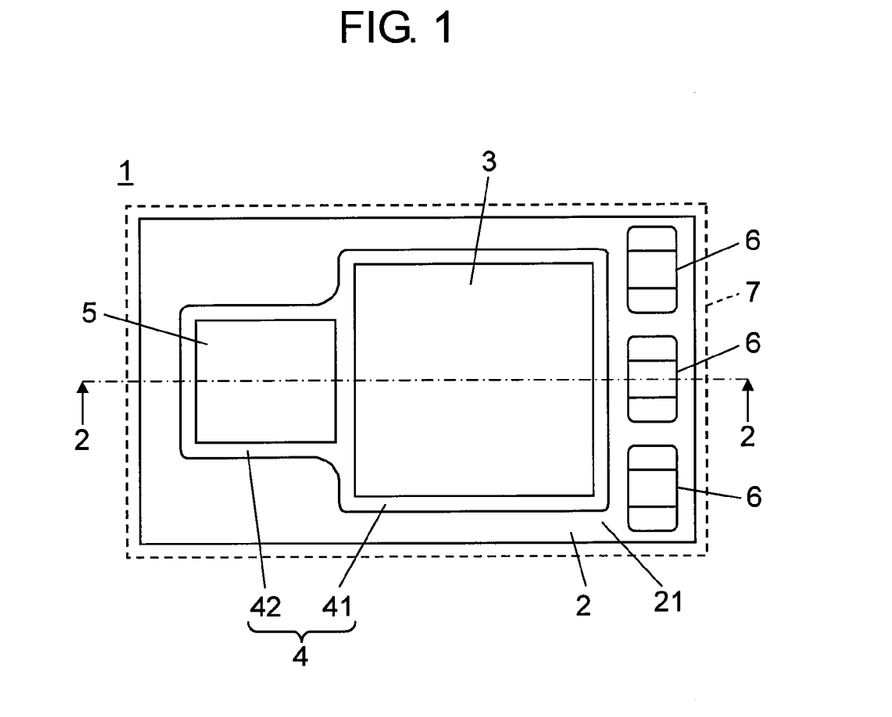
FIG. 1 shows a plan view illustrating a structure of a memory card in accordance with a first exemplary embodiment of the present invention.
Figure 2:
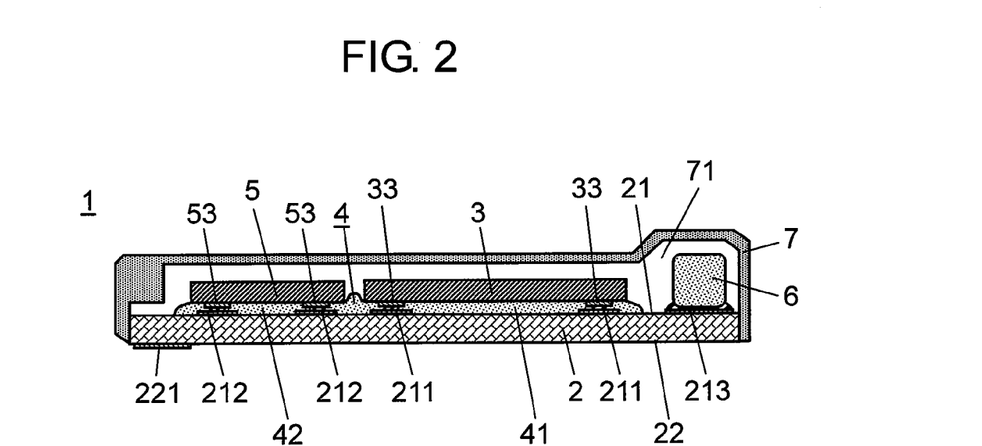
FIG. 2 shows a sectional view of the memory card shown in FIG. 1 cut along line 2-2.
Figure 5:
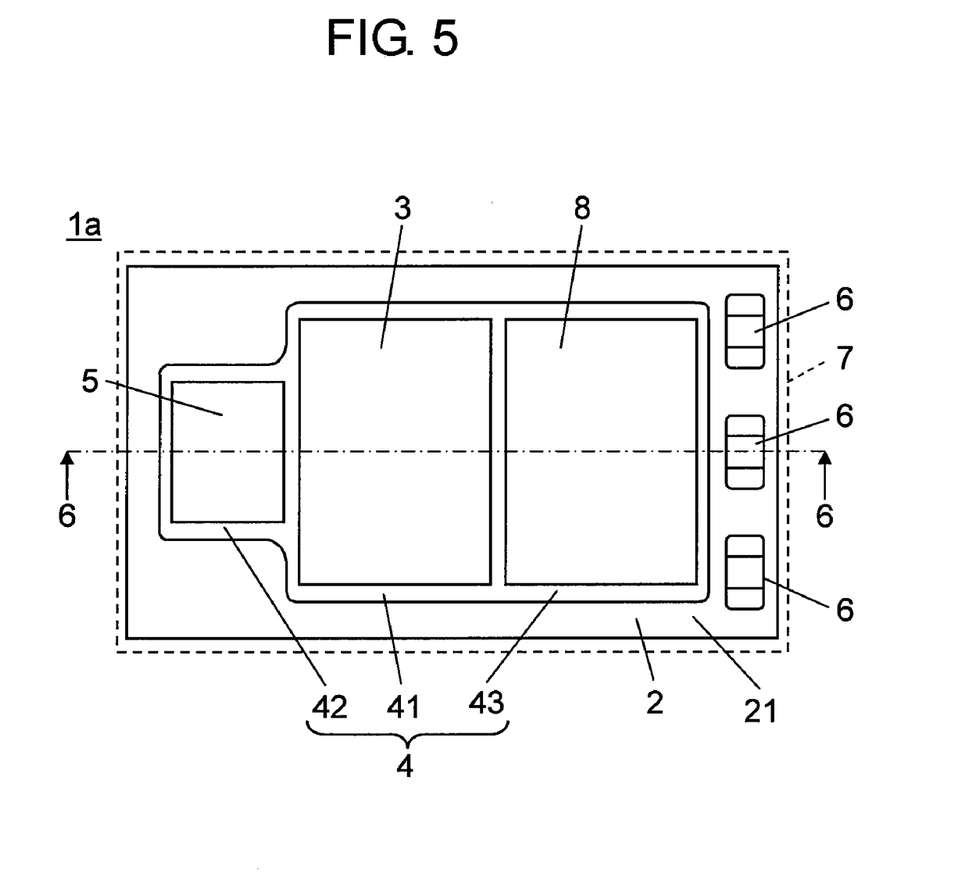
FIG. 5 shows a plan view illustrating a structure of a memory card in accordance with a second exemplary embodiment of the present invention.
Figure 7:
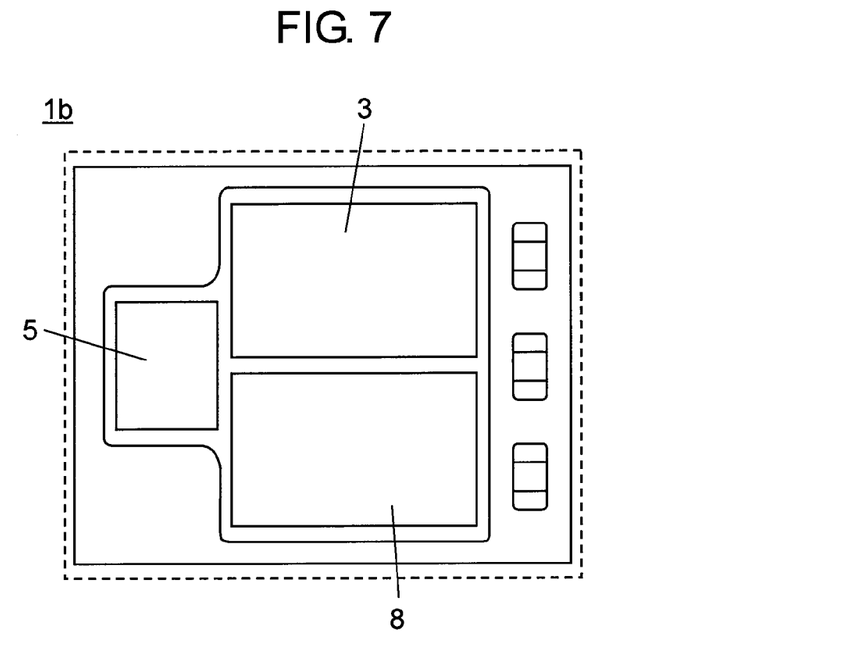
FIG. 7 shows a plan view illustrating another memory card in accordance with the second exemplary embodiment of the present invention.
Figure 8:
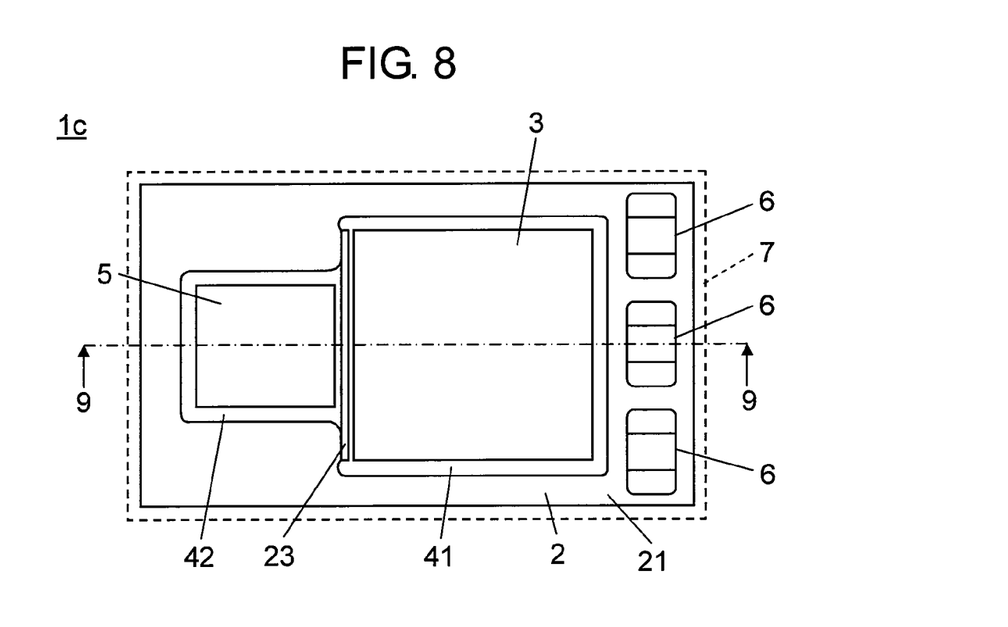
FIG. 8 shows a plan view illustrating a structure of a memory card in accordance with a third exemplary embodiment of the present invention.

FIG. 1 shows a plan view illustrating a structure of memory card 1 in accordance with the first exemplary embodiment of the present invention. FIG. 2 shows a sectional view of memory card 1 shown in FIG. 1 cut along line 2-2. In FIG. 1, cover 7 is shown only its outline with dotted lines in order to show the interior structure of memory card 1 more clearly. The covers shown in FIG. 5, FIG. 7 and FIG. 8 are drawn in a similar way.

In this exemplary embodiment, memory card 1 employs an SD memory card (Secure Digital memory card). Memory card 1 has the following typical dimensions:

Length: between 14.9 mm and 15.1 mm, (horizontal direction in FIG. 1)

Width: between 10.9 mm and 11.1 mm (vertical direction in FIG. 1)

Thickness: between 0.9 mm and 1.1 mm. (vertical direction in FIG. 2)

For a convenient purpose of description, an upper side and a lower side in FIG. 2 are referred to as an upper side and a lower side of memory card 1. In the exemplary embodiments discussed in the later sections, a similar naming system to the foregoing one is used.

As shown in FIG. 1 and FIG. 2, memory card 1 includes the following elements:

circuit board 2 shaped like a rectangle;

first semiconductor chip 3 mounted on principal face, i.e. upper side of circuit board 2, (hereinafter referred to as "top face") 21 of circuit board 2 with ball bump 33 (stud bump, and hereinafter referred to simply as "bump") sandwiched between first semiconductor chip 3 and top face 21;

second semiconductor chip 5 mounted on top face 21 of circuit board 2 with bump 53 sandwiched between second semiconductor chip 5 and top face 21;

sealing resin layer 4 existing between first semiconductor chip 3, second semiconductor chip 5 and circuit board 2;

chip component 6, including small components such as resistors, to be mounted on top face 21 with solder; and cover 7 disposed over top face 21 of circuit board 2 for covering first semiconductor chip 3, second semiconductor chip 5, sealing resin layer 4, and chip component 6.

Memory card 1 has a thickness ranging from not smaller than 0.6 mm to not greater than 0.8 mm at the sections where first semiconductor chip 3 and second semiconductor chip 5 are mounted.

Circuit board 2 is made from glass epoxy (FR-4.5 equivalent) and has a thickness ranging from not smaller than 0.1 mm to not greater than 0.4 mm. As shown in FIG. 2, circuit board 2 includes electrodes 211, 212, and 213 on its top face 21. Electrodes 211 bond to first semiconductor chip 3, electrodes 212 bond to second semiconductor chip 5, and electrodes 213 bond to chip component 6. Circuit board 2 further includes a plurality of external electrodes 221 on its under face 22 for connecting to external electronic devices. External electrodes 221 are electrically coupled to wirings formed on top face 21 of circuit board 2 via through holes (not shown) coupling between under face 22 and top face 21.

First semiconductor chip 3 and second semiconductor chip 5 are bare chips and have thickness ranging from not smaller than 0.05 mm to not greater than 0.3 mm. First semiconductor chip 3 is a memory chip for storing information, and second semiconductor chip 5 is a control chip for controlling first semiconductor chip 3. First semiconductor chip 3 and second semiconductor chip 5 are placed on circuit board 2 with a clearance over 0 mm but not greater than 1 mm therebetween so that they do not overlay on each other. At this time, only first semiconductor chip 3 and second semiconductor chip 5 are mounted to circuit board 2.

First semiconductor chip 3 includes bump 33 formed on an electrode of its under face, and bump 33 is coupled to electrode 211 of circuit board 2 with sealing resin layer 4. In a similar way, second semiconductor chip 5 includes bump 53 formed on an electrode of its under face, and bump 53 is coupled to electrode 212 of circuit board 2 with sealing resin layer 4.

In this exemplary embodiment, sealing resin layer 4 is formed, e.g. by sticking film-like resin material such as non-conductive resin film (NCF=Non-Conductive Film) onto top face 21 of circuit board 2. In the following descriptions, sealing resin layer 4 in a part, which surrounds bump 33 bonded to first semiconductor chip 3 and exists between first semiconductor chip 3 and circuit board 2, is referred to as first sealing resin layer 41. In a similar way, sealing resin layer 4 in another part, which surrounds bump 53 bonded to second semiconductor chip 5 and exists between second semiconductor chip 5 and circuit board 2, is referred to as second sealing resin layer 42. In memory card 1, first sealing resin layer 41 and second sealing resin layer 42 are formed of the same resin material such as NCF provided in a continuous shape.

Cover 7 is formed of molded components made of, e.g. epoxy resin and includes recess 71 for accommodating first semiconductor chip 3, second semiconductor chip 5, sealing resin layer 4, and chip component 6. Cover 7 is mounted to circuit board 2 by using an opening of recess 71.

Figure 3:
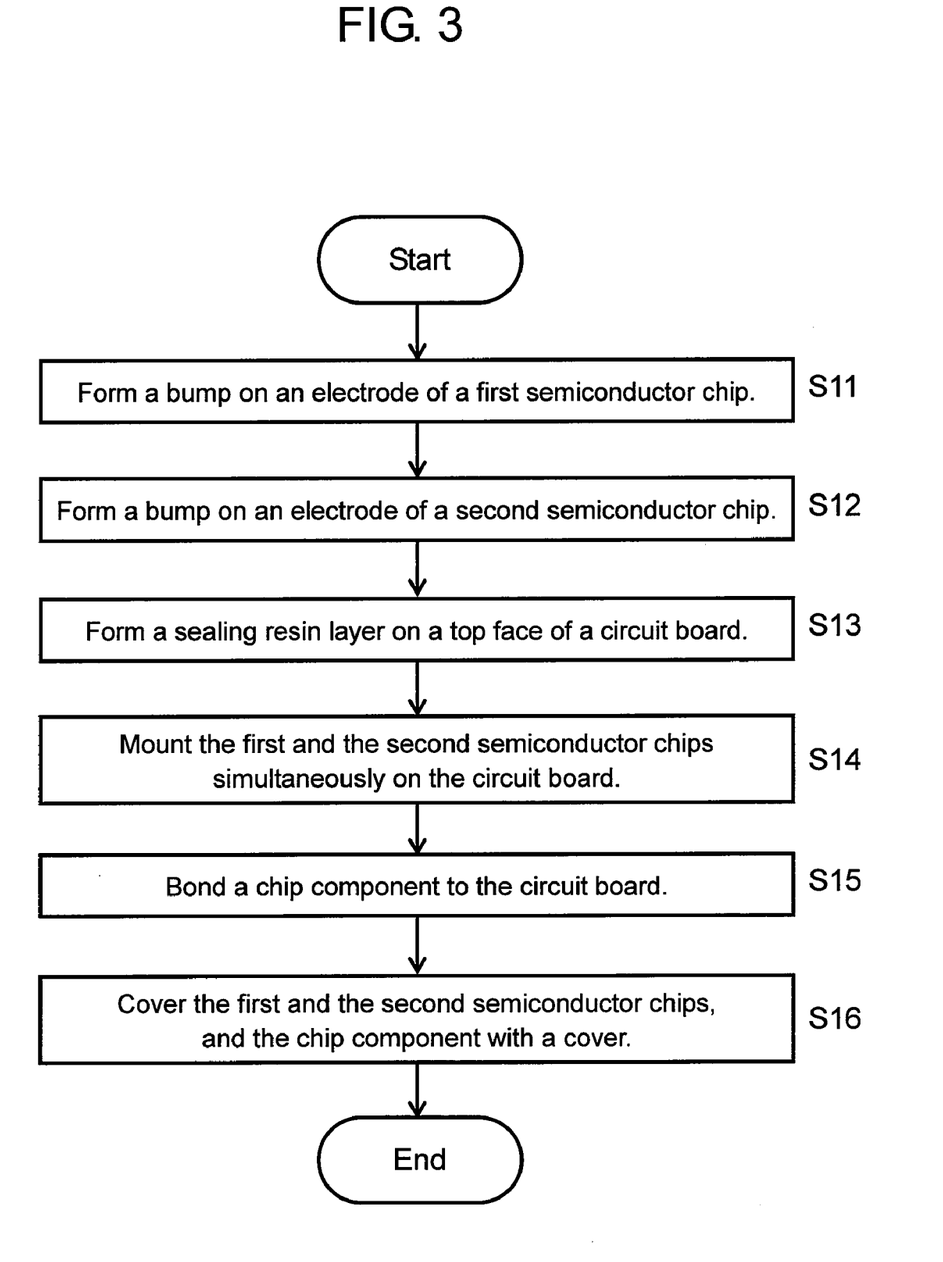
FIG. 3 shows a flowchart illustrating a method of manufacturing the memory card in accordance with the first exemplary embodiment of the present invention.
Figure 4A:
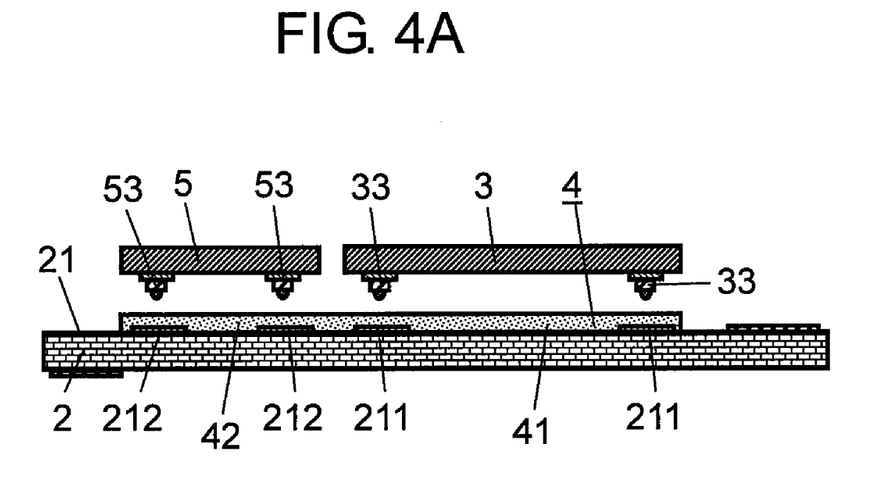
FIG. 4A shows a sectional view illustrating a major step of the manufacturing method of the memory card in accordance with the first exemplary embodiment of the present invention.
Figure 4B:
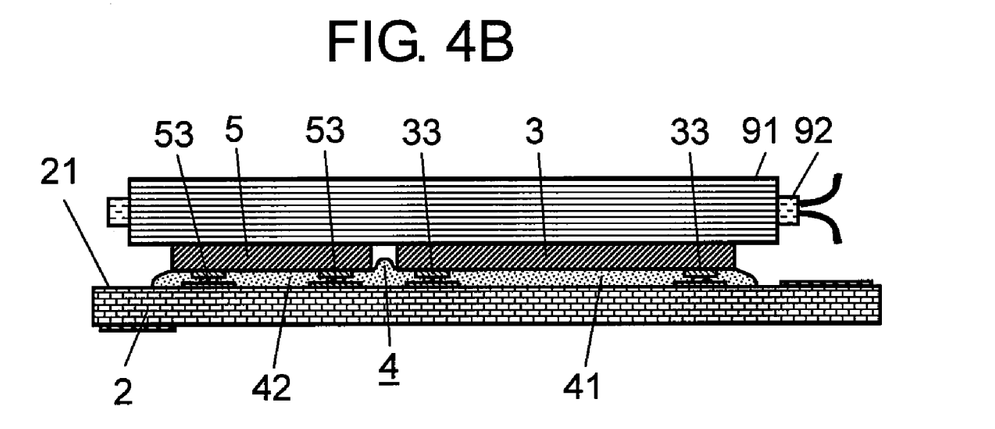
FIG. 4B shows a sectional view illustrating a major step of the manufacturing method of the memory card in accordance with the first exemplary embodiment of the present invention.

A method of manufacturing memory card 1 in accordance with the first exemplary embodiment of the present invention is demonstrated hereinafter with reference to FIG. 3, FIG. 4A, and FIG. 4B. FIG. 3 shows a flowchart illustrating the manufacturing method of memory card 1. FIGS. 4A and 4B show sectional views cut along the same line as line 2-2 of memory card 1 shown in FIG. 1 for illustrating major steps of the manufacturing method.

First, as shown in FIG. 4A, form bump 33 on an electrode of the under face of first semiconductor chip 3 (step S11). Then form bump 53 on an electrode of the under face of second semiconductor chip 5 (step S12).

Next, form sealing resin layer 4 by sticking NCF to a first mounting area including multiple electrodes 211 supposed to be mounted with first semiconductor chip 3, and to a second mounting area including multiple electrodes 212 supposed to be mounted with second semiconductor chip 5 (step S13). To be more specific, form first sealing resin layer 41 by sticking NCF to the first mounting area on top face 21 of circuit board 2, and in parallel with this formation of layer 41, form second sealing resin layer 42 by sticking the same kind of NCF as the first sealing resin 41 to the second mounting area. In other words, sealing resin layer 4 is formed of first sealing resin layer 41 and second sealing resin layer 42.

Next, hold first semiconductor chip 3 with a chip holder of a mounting device (not shown) such that the under face of first semiconductor chip 3 confronts top face 21 of circuit board 2. Then move the chip holder relatively to circuit board 2, thereby adjusting a position of first semiconductor chip 3. Bump 33 thus confront electrode 211 via first sealing resin layer 41. Further, lower the chip holder so that first semiconductor chip 3 is placed onto circuit board 2. In a similar way, second semiconductor chip 5 is placed onto circuit board 2 via second sealing resin layer 42.

Then as shown in FIG. 4B, urge chips 3 and 5 with urging tool 91 against top face 21 of circuit board 2 via first and sealing resin layers 41 and 42 corresponding to first semiconductor chip 3 and second semiconductor chip 5 respectively. At the same time, heat chips 3 and 5 with heater 92 included in urging tool 91 with chips 3 and 5 urged against circuit board 2.

First semiconductor chip 3 is thus electrically coupled to circuit board 2 with bump 33 sandwiched therebetween, and first sealing resin layer 41 is hardened so that first semiconductor chip 3 can be bonded and mounted to circuit board 2. At the same time, in parallel with the mounting of first semiconductor chip 3, second semiconductor chip 5 is electrically coupled to circuit board 2 with bump 53 sandwiched therebetween, and second sealing resin layer 42 is hardened so that second semiconductor chip 5 is bonded and mounted to circuit board 2 (step S14).

Next, as shown in FIG. 2, mount chip component 6 with solder applied to electrode 213 on top face 21 of circuit board 2, and then chip component 6 undergoes a reflow step, so that electrodes of chip component 6 and electrodes 213 of circuit board 2 are joined together for mounting chip component 6 onto circuit board 2 (step S15).

Then mount cover 7 over circuit board 2 by using an opening of recess 71 so that first semiconductor chip 3, second semiconductor chip 5, sealing resin layer 4, and chip component 6 can be covered with cover 7 on top face 21 of circuit board 2. Memory card 1 is thus completed (step S16).

As discussed above, according to this first exemplary embodiment, first semiconductor chip 3 and second semiconductor chip 5 are simultaneously flip-chip mounted in parallel with each other on circuit board 2 via sealing resin layer 4 with bumps 33 and 53 sandwiched between first semiconductor chip 3, second semiconductor chip 5 and circuit board 2 respectively. At this time, first semiconductor chip 3 and second semiconductor chip 5 can be placed with a clearance therebetween, e.g. over 0 mm but not greater than 1 mm.

The foregoing method allows mounting first semiconductor chip 3 and second semiconductor chip 5 closely to each other on top face 21 of circuit board 2, so that the structure of memory card 1 can be simplified, and a smaller and thinner body of memory card 1 is obtainable. Since the dimensions including a thickness of the memory card are standardized, excessive efforts have been made on reducing the thickness of the memory card, such as layering circuit board 2, first semiconductor chip 3 and second semiconductor chip 5 together. This first exemplary embodiment needs not such excessive efforts, and yet increases the mechanical strength against deformation. As a result, a reliable memory card is obtainable.

In the case of a conventional memory card, a semiconductor chip is mounted by, e.g. a wire-bonding method, to a circuit board, and then the chip and wire need to be sealed with, e.g. thermosetting resin having a low viscosity. For this purpose, a cover is sometimes formed by molding the thermosetting resin integrally with the sealing member, and the cover is disposed over a top face of the circuit board for covering the chip and others.

The first exemplary embodiment of the present invention, on the other hand, first semiconductor chip 3 and second semiconductor chip 5 are flip-chip mounted on circuit board 2 with bumps 33, 53 between first semiconductor chip chips 3, second semiconductor chip 5 and circuit board 2. This structure does not always need the step of sealing first semiconductor chip 3 and second semiconductor chip 5 with thermosetting resin having a low viscosity or the step of forming a cover. As a result, a degree of freedom for selecting a material or a forming method of cover 7 increases. The flip-chip mounting of first semiconductor chip 3 and second semiconductor chip 5 improves the reliability of connection done by this mounting method comparing with that done by the wire-bonding method. On top of that, since first semiconductor chip 3 and second semiconductor chip 5 are mounted to circuit board 2 via sealing resin layer 4 including first sealing resin layer 41 and second sealing resin layer 42, a step of sealing the electrically connected sections between first semiconductor chip 3, second semiconductor chip 5 and circuit board 2 can be omitted, so that the manufacture of memory card 1 can be simplified.

In this exemplary embodiment, both of first sealing resin layer 41 and second sealing resin layer 42 share sealing resin layer 4 in parts with each other, so that they can be formed in a continuous shape to each other by using the same material. This structure allows simplifying the manufacturing method of memory card 1. Sealing resin layer 4 can be formed by sticking, e.g. NCF made of film-like resin material onto top face 21 of circuit board 2, so that the manufacturing method of memory card 1 can be further simplified. On top of that, use of the cover formed of components molded in advance, for sealing first semiconductor chip 3 and second semiconductor chip 5 allows simplifying the manufacture of memory card 1 comparing with the method of forming a cover by sealing the chips with thermosetting resin or thermoplastic resin.

According to this first exemplary embodiment, first semiconductor chip 3 and second semiconductor ship 5 are simultaneously mounted in parallel with each other, so that adversary affect of a first mounting to the next mounting can be avoided, and two chips can be mounted in good condition. In other words, in the case of mounting first semiconductor chip 3 and second semiconductor chip 5 not simultaneously but sequentially, the first sealing resin layer is pushed out by first semiconductor chip 3 to the second sealing resin layer before it hardens, so that second semiconductor chip 5 cannot be mounted. The first exemplary embodiment thus prevents this problem from happening.

In this first exemplary embodiment, first sealing resin layer 41 and second sealing resin layer 42 made of same resin material are formed in a continuous shape; however, the present invention is not limited to this example. For instance, resin layers 41 and 42 can be formed independently. To be more specific, first sealing resin layer 41 is formed on the first mounting area of circuit board 2, and then sequentially, NCF can be stuck to the second mounting area on top face 21 of circuit board 2 for forming second sealing resin layer 42. Layer 41 and layer 42 can be formed of resin materials different from each other.

In the case of mounting chip 3 and second semiconductor chip 5 by soldering onto circuit board 2 in the flip-chip manner, the following method can be taken: solder first semiconductor chip 3 and second semiconductor chip 5 onto circuit board 2, then inject the sealing resin between circuit board 2 and first semiconductor chip 3, second semiconductor chip 5 in parallel for sealing the electrically connected sections. This method allows mounting first semiconductor chip 3 and second semiconductor chip 5 with a clearance not greater than 1 mm therebetween, so that memory card 1 in a simple construction and a smaller and thinner body is obtainable.

Second Exemplary Embodiment

A memory card in accordance with the second exemplary embodiment of the present invention is demonstrated hereinafter with reference to FIGS. 5 and FIG. 6. FIG. 5 shows a plan view illustrating a structure of memory card 1a in accordance with the second exemplary embodiment, and FIG. 6 shows a sectional view of memory card 1a shown in FIG. 5 cut along line 6-6.

Figure 6:
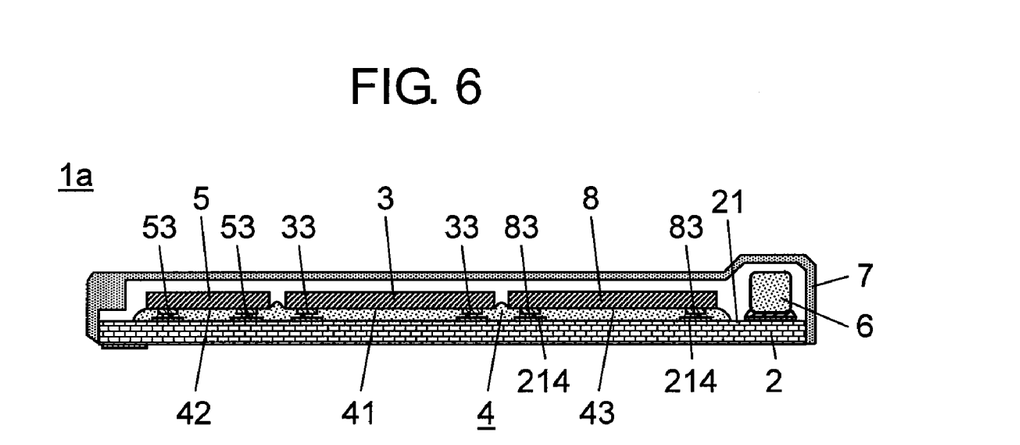
FIG. 6 shows a sectional view of the memory card shown in FIG. 5 cut along line 6-6.

As shown in FIG. 5 and FIG. 6, memory card 1a includes third semiconductor chip 8, such as a memory chip, mounted on top face 21 of circuit board 2 with bump 83 sandwiched between third semiconductor chip 8 and circuit board 2, in addition to the structure of memory card 1 shown FIGS. 1 and 2. Other structures remain unchanged from those shown in FIGS. 1 and 2, and they have the same reference marks in FIGS. 5 and 6.

Memory card 1a includes first semiconductor chip 3, second semiconductor chip 5, and third semiconductor chip 8 disposed linearly on top face 21 of circuit board 2. Third semiconductor chip 8 is placed next to first semiconductor chip 3 with a clearance, e.g. not greater than 1 mm. Third semiconductor chip 8 includes bump 83 formed on an electrode of its under face, and is bonded to electrode 214 of circuit board 2 via sealing resin layer 4 (including a state where the contact is kept). Layer 4 includes a section surrounding bump 83 bonded to third semiconductor chip 8 and existing between third semiconductor chip 8 and circuit board 2, and this section is referred to as "third sealing resin layer 43" hereinafter.

A method of manufacturing memory card 1a in accordance with the second exemplary embodiment is demonstrated hereinafter with reference to FIG. 3 used in the first exemplary embodiment.

First, form bumps 33, 53 on electrodes of under faces of first and second semiconductor chips 3, 5 (step S11). Form bump 83 on an electrode of the under face of third semiconductor chip 8 (step S12). Stick NCF onto the first and second mounting areas, and an area including multiple electrodes 214 supposed to be mounted with third semiconductor chip 8 (hereinafter this area is referred to as the third mounting area), thereby forming sealing resin layer 4 (step S13).

Next, hold first semiconductor chip 3 with a chip holder of a mounting device (not shown) and place first semiconductor chip 3 onto circuit board 2. Then place second semiconductor chip 5 and third semiconductor chip 8 sequentially onto circuit board 2 with the chip holder in a similar way. Urge first semiconductor chip 3, second semiconductor chip 5 and third semiconductor chip 8 against top face 21 of circuit board 2 via sealing resin layer 4 with an urging tool before heating those elements. Chips 3 and 5 are thus mounted to circuit board 2 simultaneously (step S14). Third semiconductor chip 8 is also mounted on circuit board 2 in parallel with the mounting of chips 3 and 5. The foregoing steps complete the mounting of three chips onto circuit board 2.

Next, solder chip component 6 to circuit board 2, then mount cover 7 over circuit board 2 for covering first semiconductor chip 3, second semiconductor chip 5, third semiconductor chip 8, sealing resin layer 4, and chip component 6 on top face 21. Memory card 1a is thus completed (steps S15, S16).

As discussed above, memory card 1a in accordance with the second exemplary embodiment includes first semiconductor chip 3 and second semiconductor chip 5 placed with a clearance, e.g. over 0 mm but not greater than 1 mm therebetween in order to prevent them from overlaying on each other. Further, first semiconductor chip 3 and third semiconductor chip 8 are placed with a clearance, e.g. over 0 mm but not greater than 1 mm therebetween in order to prevent them from overlaying on each other. This structure allows simplifying the construction of memory card 1a, and yet, achieving memory card 1a in a smaller and thinner body as proved in the first exemplary embodiment.

In this exemplary embodiment, first sealing resin layer 41, second sealing resin layer 42, and third sealing resin layer 43 share sealing resin layer 4 in parts respectively with each other, so that they can be formed of the same resin material in a continuous shape. This structure allows simplifying the manufacturing method of memory card 1a. Sealing resin layer 4 can be formed by sticking, e.g. NCF made of film-like resin material to top face 21 of circuit board 2, so that the manufacturing method of memory card 1a can be further simplified. On top of that, use of cover 7 formed of molded components allows more simplifying the manufacture of memory card 1a.

According to the second exemplary embodiment, first semiconductor chip 3, second semiconductor chip 5 and third semiconductor chip 8 are mounted to circuit board 2 in parallel and simultaneously, so that adversary affect of a mounting to the next mounting can be avoided. Three semiconductor chips thus can be mounted to circuit board 2 in good condition.

In this second exemplary embodiment, first semiconductor chip 3, second semiconductor chip 5 and third semiconductor chip 8 are arranged linearly; however, the present invention is not limited to this example. For instance, another memory card 1b shown in FIG. 7 has the following structure: third semiconductor chip 8 can be placed in parallel with first semiconductor chip 3, and second semiconductor chip 5 can be placed closely to the foregoing two chips with a clearance, e.g. over 0 mm but not greater than 1 mm.

In this exemplary embodiment, three semiconductor chips are mounted on the circuit board; however, the present invention is not limited to this example. For instance, four or more than four semiconductor chips can be mounted on top face 21 of circuit board 2. In this case, it is preferable to place the chips with a clearance therebetween, e.g. over 0 mm but not greater than 1 mm, from the stand point of downsizing memory card 1a.

Third Exemplary Embodiment

A memory card in accordance with the third exemplary embodiment of the present invention is demonstrated hereinafter with reference to FIG. 8 and FIG. 9. FIG. 8 shows a plan view illustrating a structure of memory card 1c in accordance with the third exemplary embodiment, and FIG. 9 shows a sectional view of memory card 1c shown in FIG. 8 cut along line 9-9.

Figure 9:
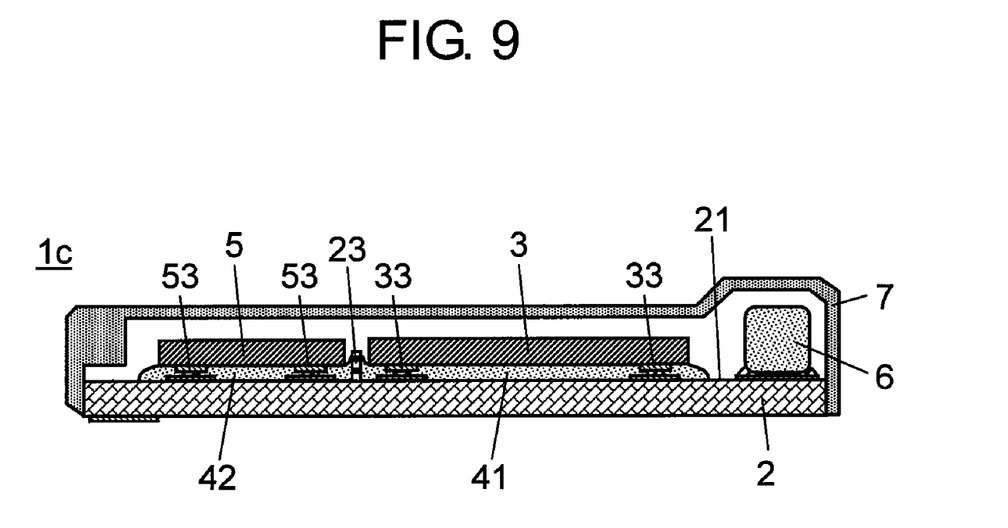
FIG. 9 shows a sectional view of the memory card shown in FIG. 8 cut along line 9-9.

As shown in FIGS. 8 and 9, memory card 1c includes linear protrusion 23 existing between first semiconductor chip 3 and second semiconductor chip 5 and extending on top face 21 of circuit board 2. This linear protrusion 23 is newly added to the structures shown in FIGS. 1 and 2. Other structures of memory card 1c remain unchanged from those in FIGS. 1 and 2, and they have the same reference marks as those used in FIGS. 1 and 2 in the following description. In memory card 1c, first sealing resin layer 41 and second sealing resin layer 42 are separated by linear protrusion 23, so that they are not in a continuous shape.

Figure 10:
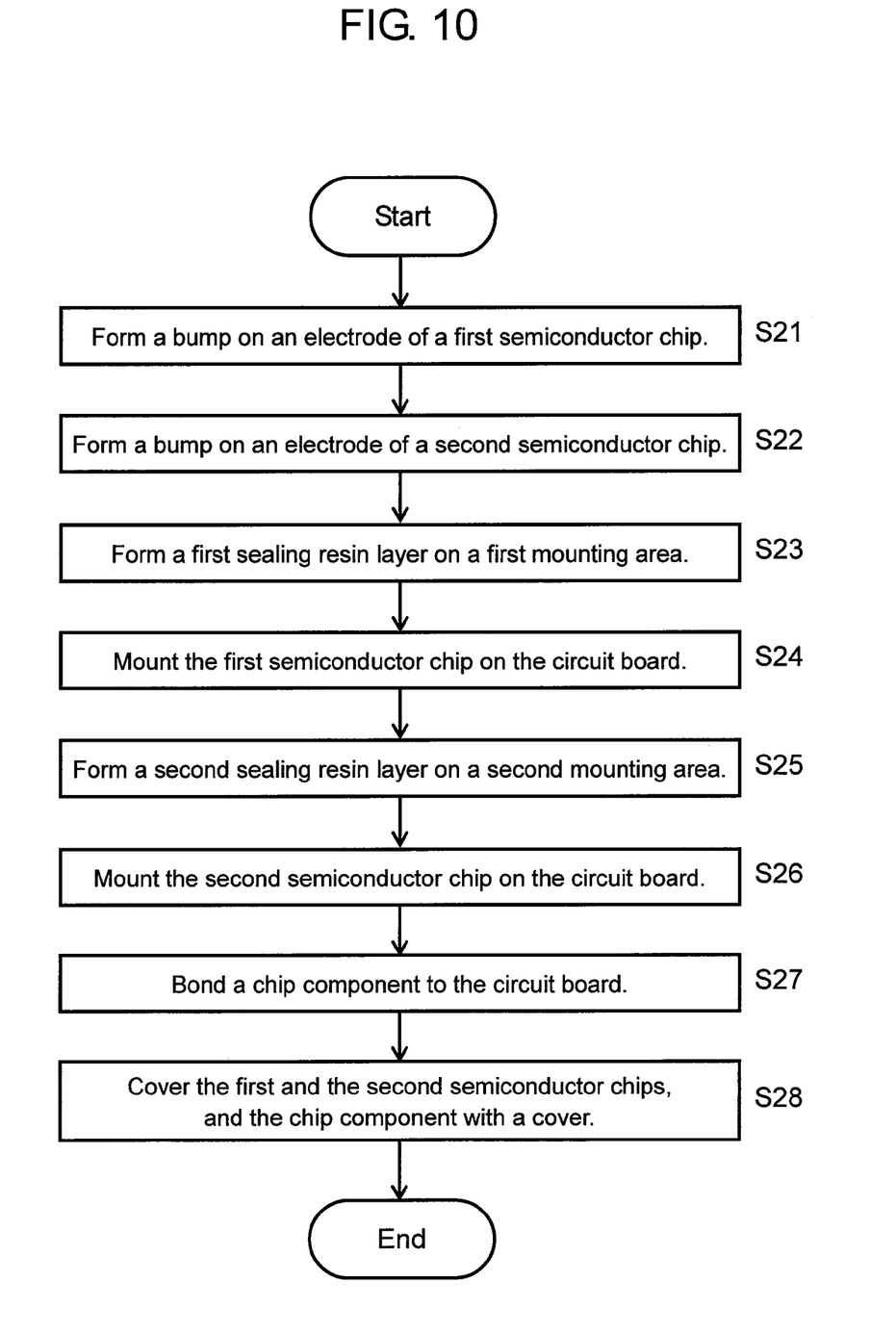
FIG. 10 shows a flowchart illustrating a method of manufacturing the memory card in accordance with the third exemplary embodiment of the present invention.

A method of manufacturing memory card 1c in accordance with the third exemplary embodiment is demonstrated hereinafter with reference to FIG. 10, which shows a flowchart illustrating the manufacturing method.

First, form bumps 33 and 53 on electrodes of the under faces of first semiconductor chip 3 and second semiconductor chip 5 (steps S21, S22). Then stick, e.g. NCF, to the first mounting area of top face 21 of circuit board 2, thereby forming first sealing resin layer 41 (step S23).

Next, hold first semiconductor chip 3 with a chip holder of a mounting device (not shown) for placing first semiconductor chip 3 onto circuit board 2 via first sealing resin layer 41. Then urge first semiconductor chip 3 against top face 21 of circuit board 2 with an urging tool, and then heat first semiconductor chip 3 for mounting first semiconductor chip 3 to circuit board 2 (step S24). At this time, first sealing resin layer 41 on the first mounting area is pressed out to the surrounding of first semiconductor chip 3, but it is dammed up by linear protrusion 23 disposed between first semiconductor chip 3 and second semiconductor chip 5, so that first sealing resin layer 41 is prevented from spreading over the second mounting area. First semiconductor chip 3 is thus mounted to circuit board 2 through the steps discussed above.

Next, independently of the formation of first sealing resin layer 41, stick NCF to the second mounting area for forming second sealing resin layer 42 (step S25). Next, hold second semiconductor chip 5 with a chip holder of the mounting device (not shown) for placing second semiconductor chip 5 onto circuit board 2 via second sealing resin layer 42. Then urge second semiconductor chip 5 against top face 21 of circuit board 2 with an urging tool, and then heat second semiconductor chip 5 for mounting second semiconductor chip 5 to circuit board 2. Second semiconductor chip 5 is thus mounted on circuit board 2 independently of the mounting of first semiconductor chip 3 (step S26). The steps discussed above thus complete the mounting of second semiconductor chip 5 to circuit board 2.

Next, chip component 6 is bonded to circuit board 2, then cover chip 3, second semiconductor chip 5, first sealing resin layer 41, second sealing resin layer 42, and chip component 6 with cover 7 over top face 21 of circuit board 2, so that memory card 1c is manufactured (steps S27, S28).

The structure discussed above allows memory card 1c in accordance with the third exemplary embodiment to prevent first sealing resin layer 41 from spreading over the second mounting area with linear protrusion 23 disposed between first semiconductor chip 3 and second semiconductor chip 5 when first semiconductor chip 3 is mounted to circuit board 2. In a similar way, the structure also allows memory card 1c to prevent second sealing resin layer 42 from spreading over the first mounting area when second semiconductor chip 5 is mounted to circuit board 2. As a result, adversary affect of a mounting to the next mounting can be avoided, so that two semiconductor chips can be mounted to circuit board 2 in good condition.

In this third exemplary embodiment, first semiconductor chip 3 is mounted before second sealing resin layer 42 is formed; however, the present invention is not limited to this example. For instance, second sealing resin layer 42 can be formed after first sealing resin layer 41 is formed. In this case, since layer 41 and layer 42 are not formed in a continuous shape, so that the heat applied to layer 41 during the mounting of first semiconductor chip 3 can be prevented from traveling to layer 42. As a result, second sealing resin layer 42 can be prevented from hardening when first semiconductor chip 3 is mounted, namely, before second semiconductor chip 5 is mounted.

In this exemplary embodiment, first semiconductor chip 3 and second semiconductor chip 5 are mounted to circuit board 2 independently; however, the present invention is not limited to this example. For instance, in the case of linear protrusion 23 having a height lower than the heights of first semiconductor chip 3 and second semiconductor chip 5 mounted to circuit board 2 (the height is measured from top face 21), the two chips can be urged against circuit board 2 simultaneously with one urging tool. This structure thus improves the productivity of the memory card.

Fourth Exemplary Embodiment

Figure 11:
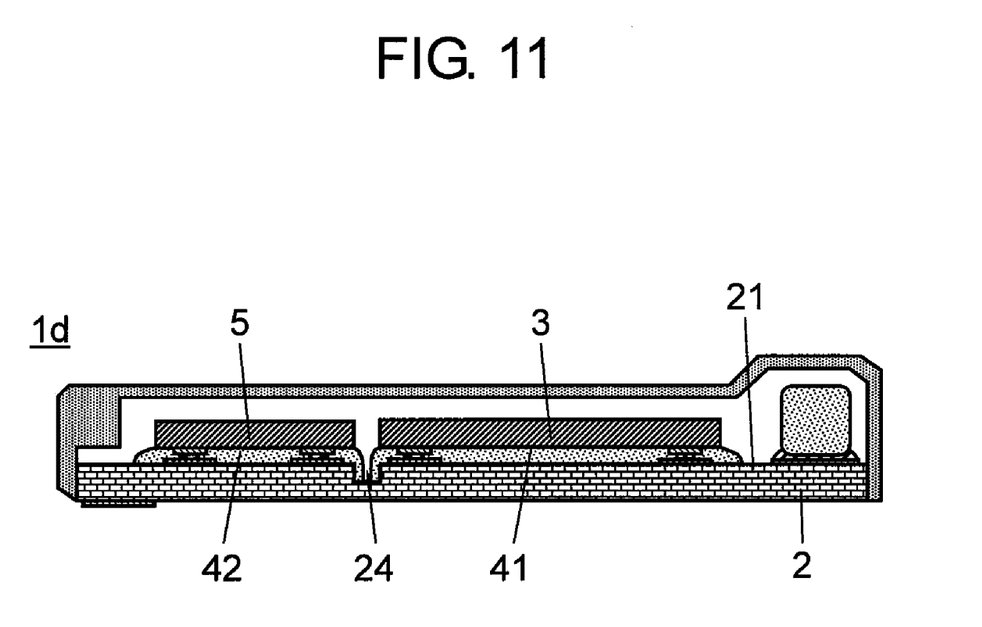
FIG. 11 shows a sectional view of a memory card in accordance with a fourth exemplary embodiment of the present invention.

A memory card in accordance with the fourth exemplary embodiment is demonstrated hereinafter with reference to FIG. 11, which shows a sectional view illustrating a structure of memory card 1d in accordance with the fourth exemplary embodiment of the present invention.

Memory card 1d differs from memory card 1c in accordance with the third exemplary embodiment in linear recess 24 formed on top face 21 of circuit board 2 and between first semiconductor chip 3 and second semiconductor chip 5. First sealing resin layer 41 is isolated from second sealing resin layer 42 by linear recess 24, so that they are not in a continuous shape. Other structures remain unchanged from those shown in FIGS. 8 and 9, and they have the same reference marks as those shown in FIGS. 8 and 9. A method of manufacturing memory card 1d is similar to the method demonstrated in the third exemplary embodiment, so that the description thereof is omitted here.

The structure discussed above allows first sealing resin layer 41 of memory card 1d to flow into linear recess 24, although first sealing resin layer 41 is pressed out during the mounting of first semiconductor chip 3 to circuit board 2. As a result, first sealing resin layer 41 can be prevented from spreading over the second mounting area as it is done in the third exemplary embodiment. In a similar way, second sealing resin layer 42 can be also prevented from spreading over the first mounting area during the mounting of second semiconductor chip 5 to circuit board 2. Adversary affect of one mounting to the next mounting can be thus avoided, so that the two chips can be mounted to circuit board 2 in good condition as the are done in the third exemplary embodiment.

Various exemplary embodiments are discussed previously, however, the present invention is not limited to those exemplary embodiments, and a variety of changes described below are applicable to the present invention.

In the previous exemplary embodiments, first semiconductor chip 3 and second semiconductor chip 5 work as a memory chips and a control chip respectively; however, the present invention is not limited to this example. For instance, other bare chips such as ASIC can be used as first semiconductor chip 3 and second semiconductor chip 5. Further, two memory chips are prepared, and they are layered together as first semiconductor chip 3 and second semiconductor chip 5, then they can be controlled by a control chip mounted to another area of circuit board 2. As second semiconductor chip 5, another memory chip that stores information and also controls other memory chips, i.e. this memory chip does double duty as a control chip, cam be mounted to circuit board 2. At this time, the chip can use a semiconductor function in parts, and the chip as a whole does not necessarily include the semiconductor function.

In the previous exemplary embodiments, bumps 33, 53 and 83 are formed on the electrodes of first semiconductor chip 3, second semiconductor chip 5 and third semiconductor chip 8; however, those bumps can be formed on electrodes 211, 212, and 214 of circuit board 2. Other types of bumps such as another type of ball pump, plated bump, or soldered bump can be used as bumps 33, 53 and 83.

In the previous exemplary embodiments, NCF is used as the sealing resin layer; however, the present invention is not limited to this example, for instance, the sealing resin layer can be formed by applying non-conductive resin paste, anisotropic conductive resin film, or anisotropic conductive resin paste. In the case of using the resin paste to form the sealing resin layer in exemplary embodiments 1 and 2, the resin material is applied to the first mounting area with a dispenser, and then the resin material can be applied to the second mounting area sequentially. In this case, the dispenser can go back and forth between the first mounting area and the second mounting area so that the resin material can be applied linearly thereto in parallel.

In the case of using the resin paste to form the sealing resin layer in exemplary embodiment 1, first semiconductor chip 3 and second semiconductor chip 5 can be mounted in the following manner: First, place first semiconductor chip 3 on first sealing resin layer 41, and then tentatively harden first sealing resin layer 41 to some extent. Then place second semiconductor chip 5 on second sealing resin layer 42, and then harden second sealing resin layer 42 tentatively to some extent. Then urge both of first semiconductor chip 3 and second semiconductor chip 5 against circuit board 2 simultaneously before heating them. These steps allow mounting chips 3 and 5 simultaneously to circuit board 2, so that adversary affect of one mounting to the next mounting can be avoided, and the two chips can be mounted in good condition to circuit board 2.

In the previous exemplary embodiments, the cover formed of molded components made of resin is used; however, the present invention is not limited to this example. For instance, thermosetting resin or thermoplastic resin is insert-molded to form a cover, with which first semiconductor chip 3, second semiconductor chip 5 and so on can be covered on top face 21 of circuit board 2.

The memory card of the present invention can be used as other card-shaped memory media, such as an IC card, in addition to an SD card.

INDUSTRIAL APPLICABILITY

The present invention is useful for the technical field where memory cards are required to be downsized and have a thinner body.

The invention claimed is:

1. A memory card comprising:
a circuit board;
a first semiconductor chip mounted on a principal face of the circuit board with a bump sandwiched between the first semiconductor chip and the circuit board;
a second semiconductor chip mounted on the principal face of the circuit board with a bump sandwiched between the second semiconductor chip and the circuit board and with a clearance not greater than 1 mm between the first semiconductor chip and the second semiconductor chip;
a first sealing resin layer for surrounding the bump bonded to the first semiconductor chip and existing between the first semiconductor chip and the circuit board;
a second sealing resin layer for surrounding the bump bonded to the second semiconductor chip and existing between the second semiconductor chip and the circuit board; and
a cover disposed over the principal face of the circuit board for covering the first semiconductor chip and the second semiconductor chip disposed on the principal face of the circuit board,
wherein the circuit board includes one of a linear protrusion and a linear recess extending on the principal face of the circuit board and between the first semiconductor chip and the second semiconductor chip.

2. The memory card of claim 1, wherein the first sealing resin layer and the second sealing resin layer are made of the same kind of resin material and formed in a continuous shape to each other.

3. The memory card of claim 1, wherein the first sealing resin layer and the second sealing resin layer are formed of film-like resin material stuck to the principal face of the circuit board.

4. The memory card of claim 1, wherein the first semiconductor chip works as a memory chip for storing information, and the second semiconductor chip works as a control chip for controlling the first semiconductor chip.

5. The memory card of claim 1 further comprising:
a third semiconductor chip mounted on the principal face of the circuit board with a bump sandwiched between the third semiconductor chip and the circuit board and at a clearance not greater than 1 mm between the third semiconductor chip and the first semiconductor chip; and
a third sealing resin layer for surrounding the bump, which is bonded to the third semiconductor chip, and existing between the third semiconductor chip and the circuit board.

6. A memory card comprising:
a circuit board;
a first semiconductor chip mounted on a principal face of the circuit board with a bump sandwiched between the first semiconductor chip and the circuit board;
a second semiconductor chip mounted on the principal face of the circuit board with a bump sandwiched between the second semiconductor chip and the circuit board and with a clearance not greater than 1 mm between the first semiconductor chip and the second semiconductor chip;
a first sealing resin layer for surrounding the bump bonded to the first semiconductor chip and existing between the first semiconductor chip and the circuit board;
a second sealing resin layer for surrounding the bump bonded to the second semiconductor chip and existing between the second semiconductor chip and the circuit board; and
a cover disposed over the principal face of the circuit board for covering the first semiconductor chip and the second semiconductor chip disposed on the principal face of the circuit board,
wherein the cover includes a recess for accommodating the first semiconductor chip and the second semiconductor chip, and is formed of a molded component to be mounted to the circuit board by using an opening of the recess.

7. A method of manufacturing a memory card, the method comprising steps of:
(a) forming a first sealing resin layer on a principal face of a circuit board;
(b) forming a second sealing resin layer on the principal face of the circuit board;
(c) urging a first semiconductor chip against the principal face of the circuit board with a bump sandwiched between the first semiconductor chip and the circuit board via the first sealing resin layer for electrically coupling the first semiconductor chip to the circuit board, and hardening the first sealing resin layer;
(d) in parallel with step (c), urging a second semiconductor chip with a clearance not greater than 1 mm between the first semiconductor chip and the second semiconductor chip against the principal face of the circuit board with a bump sandwiched between the second semiconductor chip and the circuit board via the second sealing resin layer for electrically coupling the second semiconductor chip to the circuit board, and hardening the second sealing resin layer; and
(e) covering the first semiconductor chip and the second semiconductor chip on the principal face of the circuit board with a cover.

8. The manufacturing method of claim 7, wherein the first semiconductor chip and the second semiconductor chip are placed with a clearance therebetween.

9. The manufacturing method of claim 7, wherein the first sealing resin layer and the second sealing resin layer are made of the same kind of resin material, and step (a) and step (b) are carried out sequentially or in parallel with each other.

10. The manufacturing method of claim 7,
wherein the cover is formed of a molded component and includes a recess, and
wherein step (e) includes a step of accommodating the first semiconductor chip and the second semiconductor chip in the recess, and a step of mounting the cover to the circuit board by using an opening of the recess.

11. The manufacturing method of claim 7, wherein in step (a) the first sealing resin layer is formed by sticking film-like resin material onto the principal face of the circuit board, and in step (b) the second sealing resin layer is formed by sticking film-like resin material onto the principal face of the circuit board.

12. The manufacturing method of claim 7, wherein the first semiconductor chip works as a memory chip for storing information, and the second semiconductor chip works as a control chip for controlling the first semiconductor chip.

13. The memory card of claim 1, wherein the cover includes a recess for accommodating the first semiconductor chip and the second semiconductor chip, and is formed of a molded component to be mounted to the circuit board by using an opening of the recess.

* * * * *